United States Patent [19]

Nishimori

[11] Patent Number: 5,233,241

[45] Date of Patent: Aug. 3, 1993

[54] SEMICUSTOM MADE INTEGRATED CIRCUIT EQUIPPED WITH CONTROLLER FOR INPUT/OUTPUT BUFFERS

[75] Inventor: Hiroaki Nishimori, Tokyo, Japan

[73] Assignee: NEC Corporation, Tokyo, Japan

[21] Appl. No.: 797,034

[22] Filed: Nov. 25, 1991

[30] Foreign Application Priority Data

Nov. 24, 1990 [JP] Japan .................. 2-318616

[51] Int. Cl.[5] .......................................... H03K 19/173
[52] U.S. Cl. ................................... 307/465; 307/473
[58] Field of Search .................... 307/465, 465.1, 473, 307/475; 340/825.83, 825.87; 364/716

[56] References Cited

U.S. PATENT DOCUMENTS

| | | | |
|---|---|---|---|
| 4,783,606 | 11/1988 | Goetting | 307/465 |
| 4,987,319 | 1/1991 | Kawana | 307/465 |
| 5,046,035 | 9/1991 | Jigour et al. | 364/716 |
| 5,105,388 | 4/1992 | Itano et al. | 307/465 |

Primary Examiner—David R. Hudspeth
Assistant Examiner—Jon Santamauro
Attorney, Agent, or Firm—Sughrue, Mion, Zinn, Macpeak & Seas

[57] ABSTRACT

A semicustom made integrated circuit is fabricated from first function blocks completed before acceptance of an order from a customer, second function blocks completed after the acceptance of order, input/output buffer circuits coupled with the first function blocks, buffer circuits respectively associated with the second function blocks, and controlling circuits provided in association with the buffer circuits for shifting the associated buffer circuits between input buffer circuits, output buffer circuits, bidirectional buffer circuits and three-state buffer circuits, and the controlling circuits are instructed by the second function blocks while the manufacturer is designing the wiring arrangement of the second function blocks so that the manufacturer does not need to individually tailor the wiring arrangement between the second function blocks and the associated buffer circuits.

7 Claims, 4 Drawing Sheets

SEMICUSTOM MADE INTEGRATED CIRCUIT EQUIPPED WITH CONTROLLER FOR INPUT/OUTPUT BUFFERS

FIELD OF THE INVENTION

This invention relates to a semicustom made integrated circuit and, more particularly, to a controller associated with input and output buffer circuits for determining allowable directions of input and output signals.

DESCRIPTION OF THE RELATED ART

A typical example of the semicustom made integrated circuit is illustrated in FIG. 1, and is fabricated on a single semiconductor chip 1. The manufacturer has prepared two kinds of logic gate array which are respectively complete and incomplete. Namely, the manufacturer has already completed design work for not only the component logic gates of the first logic gate array 2 but also the wirings therebetween before accepting an order. Therefore, the function of the complete gate array 2 has been fixed, and input and output buffer circuits 3a and 3b as well as pads 4a and 4b have been associated with the component logic gates of the complete gate array 2. However, wirings between the complete gate array 2, the input and output buffer circuits 3a and 3b and the pads 4a and 4b have not been designed yet. As to the second logic gate array 5, the manufacturer has merely completed the design work for the component logic gates of the second logic gate array 5, and the wirings of the incomplete gate array 5 are tailored after the acceptance of the order. Therefore, the function of the incomplete gate array 5 has not been determined yet, and, accordingly, any input or output buffer circuit as well as any pad have not been associated with the incomplete gate array 5 yet.

After the acceptance of the order, the manufacturer designs a semicustom made integrated circuit, and determines the layout of the gate arrays in accordance with a design specification provided from the customer. Namely, the manufacturer arranges the complete and the incomplete gate arrays 2 and 5 on the semiconductor chip 1, and designs the wiring of the incomplete gate array 5 so that the function of the gate array 5 is determined. When the function of the logic gate array 5 is determined, it is possible for the manufacturer to decide what kind of buffer circuit should be associated with the logic gate array 5, If an input buffer circuit 6 and a pad 7 are necessary for the logic gate array 5, the manufacturer selects the input buffer circuit 6 and the pad 7 from an input and output buffer array provided in a periphery of the semiconductor chip 1. Finally, the manufacturer designs wiring arrangement between the component logic gates of the logic gate arrays 2 and 5, the input and output buffer circuits 3a, 3b and 6 and the pads 4a, 4b and 7.

However, a problem is encountered in the prior art semicustom made integrated circuit in that the manufacturer tends to fall into an error while arranging the wirings between the logic gate arrays 2 and 5, the input and output buffer circuits 3a, 3b and 6 and the pads 4a, 4b and 7. This is because of the fact that the wiring arrangement between the logic gate arrays 2 and 5, the input and output buffer circuits 3a, 3b and 6 and the pads 4a, 4b and 7 is individually designed after the acceptance of the order. The manufacturer needs to redesign the wiring arrangement, and the redesign work consumes time and labor.

SUMMARY OF THE INVENTION

It is therefore an important object of the present invention to provide a semicustom made integrated circuit which can prevent a manufacturer from wiring error between an incomplete logic gate array and buffer circuits.

To accomplish these objects, the present invention proposes to select complete signal paths between a logic gate array and associated buffer circuit depending upon the function of a logic gate array.

In accordance with the present invention, there is provided a semicustom made integrated circuit fabricated on a single semiconductor chip, comprising: a) at least one first function block a wiring arrangement of which has been completed so as to fix the function thereof before accepting an order of a customer; b) at least one second function block a wiring arrangement of which is completed so as to fix the function thereof after the acceptance of the order of the customer, the at least one second function block producing instruction signals indicative of what kind of buffer circuit is necessary for the function thereof; and c) at least one buffer circuit means associated with the at least one second function block, and selectively serving as one of an input buffer, an output buffer, a bidirectional buffer and a three-state buffer depending upon the instruction signals.

BRIEF DESCRIPTION OF THE DRAWINGS

The features and advantages of the semicustom made integrated circuit according to the present invention will be more clearly understood from the following description taken in conjunction with the accompanying drawings in which.

DESCRIPTION OF THE PREFERRED EMBODIMENT

Figure 1:
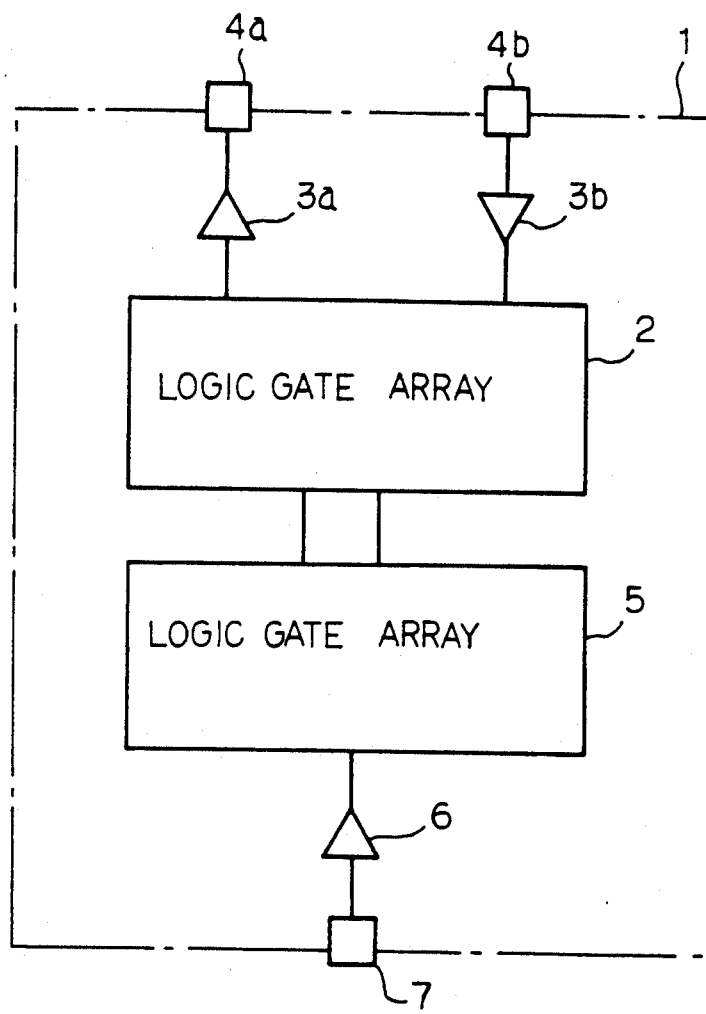
FIG. 1 is a block diagram showing the arrangement of the prior art semicustom made integrated circuit.
Figure 2:
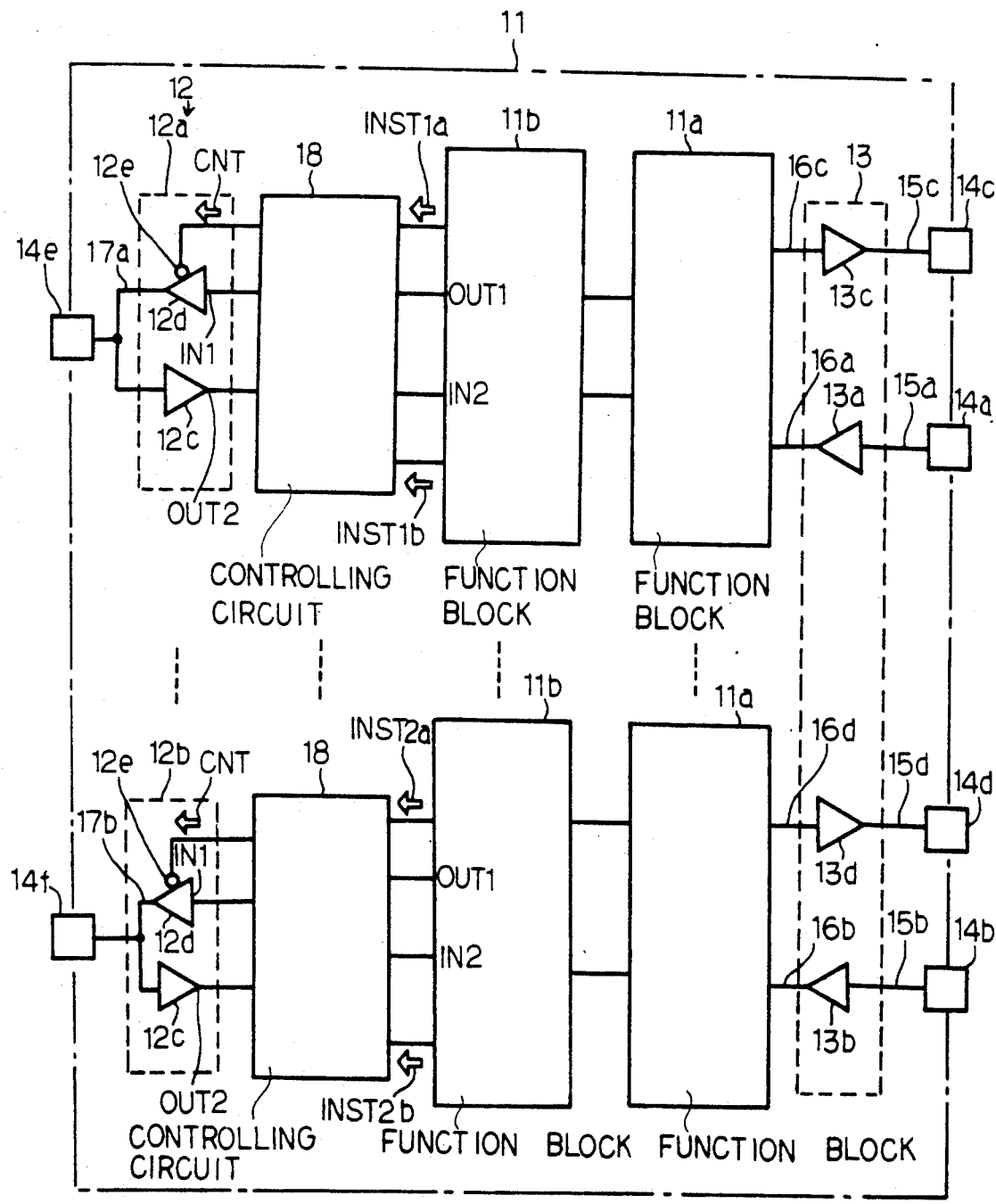
FIG. 2 is a block diagram showing the arrangement of a semicustom made integrated circuit according to the present invention.

Referring to FIG. 2 of the drawings, a semicustom made integrated circuit embodying the present invention is fabricated on a single semiconductor chip 11. A manufacturer has prepared various kinds of function blocks 11a and 11b selectively integrated on the single semiconductor chip 11. The function blocks 11a and 11b are broken down into two categories, i.e., a complete function block 11a and an incomplete function block 11b, and both complete and incomplete function blocks 11a and 11b are implemented by logic gate arrays in this instance. The manufacturer has completed the design work for arrangement of component logic gates of the complete function block 11a as well as for wiring arrangement thereof before accepting an order from a customer, and, for this reason, the functions of the complete function blocks 11a have been already fixed. On the other hand, design work of the incomplete function blocks 11b have been carried out for arrangement of component transistors of logic gates only before the acceptance of the order, and the manufacturer tailors wiring arrangements of the incomplete function blocks 11b in accordance with a design specification provided from the customer. Therefore, each incomplete function block 11b has not been fixed, but can achieve a wide variety of function. In this instance, each of the incomplete function blocks 11b are adapted to produce instruction signals INST1a and INST1b, or INST2a and INST2b, and the instruction signals INST1a and INST1b, or INST2a and INST2b are indicative of what kind of buffer circuit should be associated therewith.

According to the present invention, the manufacturer has further prepared a bidirectional buffer circuit block 12 and a unidirectional buffer circuit block 13. The unidirectional buffer circuit block 13 contains a plurality of input buffer circuits 13a and 13b, and a plurality of output buffer circuits 13c and 13d, and is provided for the complete function blocks 11a. The input and output buffer circuits 13a to 13d are connectable with pads 14a, 14b, 14c and 14d through wirings 15a, 15b, 15c and 15d, and are further connectable with the complete function blocks 11a and 11a through wirings 16a, 16b, 16c and 16d.

The bidirectional buffer circuit block 12 contains a plurality of bidirectional buffer circuits 12a and 12b, and each of the bidirectional buffer circuits 12a and 12b is implemented by an input buffer circuit 12c and a three-state buffer circuit 12d associated with an inverting circuit 12e. Pads 14e and 14f are shared between the input buffer circuits 12c and the three-state buffer circuits 12d of the associated bidirectional buffer circuits 12a and 12b, and wirings 17a and 17b are arranged for the bidirectional buffer circuits 12a and 12b.

Figure 3:
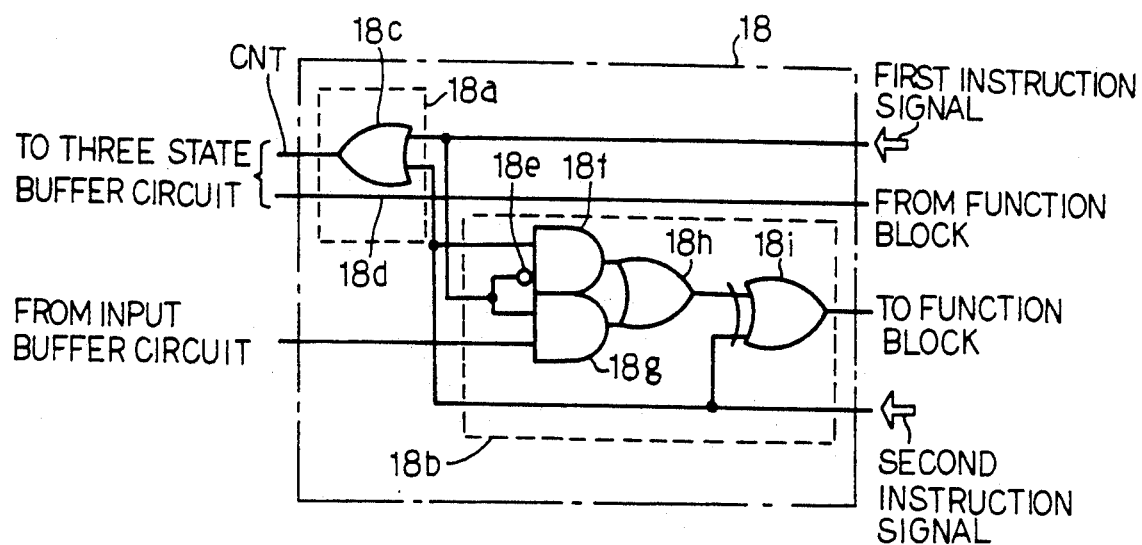
FIG. 3 is a logic diagram showing the circuit arrangement of a controlling circuit incorporated in the semicustom made integrated circuit shown in FIG. 2.

In accordance with the present invention, the manufacturer has further prepared a controlling circuit block 18 the detailed circuit arrangement of which is illustrated in FIG. 3. The controlling circuit block 18 has a first controlling section 18a associated with the three state buffer circuit 12d, and a second controlling section 18b provided for the input buffer circuit 12c, and the first and second sections 18a and 18b selectively establish and cut off signal paths between the associated incomplete function block 11b and the associated bidirectional buffer circuit 12a or 12b depending upon the first and second instruction signals. The "first instruction signal" stands for one of the instruction signals INST1a and INST2a, and the "second instruction signal" means any one of the instruction signals INST1b and INST2b. In this instance, the controlling circuit block 18 and the bidirectional buffer circuit 12a or 12b as a whole constitute a buffer circuit means.

The first section 18a is implemented by an OR gate 18c and a conductive path 18d, and the OR gate 18c is responsive to the first and second instruction signals for producing a controlling signal CNT supplied to the inverting circuit 12e associated with the controlling node of the three-state buffer circuit 12d. The conductive path 18d is directly coupled between an signal output node OUT1 of the associated incomplete function block 11b and an input node IN1 of the three state buffer circuit 12d. Therefore, the three-state buffer circuit 12d selectively enters a high-impedance state and an active state depending upon the controlling signal CNT. In detail, if both first and second instruction signals are in logic "0" level, the OR gate 18c yields the controlling signal CNT of logic "0" level, and the inverting circuit 12e causes the three-state buffer circuit 12d to enter the active state for transferring an output signal on the conductive path 18d to the associated pad as summarized in the first row of Table 1. However, if at least one of the first and second instruction signals is logic "1" level, the controlling signal CNT remains in logic "1" level, and the inverting circuit 12e never allows the three-state buffer circuit 12d to transfer the output signal on the conductive path 18d to the pad.

The second section 18b comprises an inverting circuit 18e, two AND gates 18f and 18g, an OR gate 18h and an exclusive-OR gate 18i, and the output node OUT2 of the input buffer circuit 12c is coupled with the AND gate 18g. The first instruction signal is supplied to the inverting circuit 18e and the AND gate 18g, and the output node of the inverting circuit 18e is coupled with the input node of the AND gate 18f. The input nodes of the OR gate 18h are coupled with the output nodes of the AND gates 18f and 18g, and the output node of the OR gate 18h is coupled with the input node of the exclusive-OR gate 18i. The second instruction signal is distributed to the AND gate 18f and the exclusive-OR gate 18i. The output node of the exclusive-OR gate 18i is coupled with an input node of the associated incomplete function block 11b. While the first section 18a produces the control signal of logic "0" level in the presence of the first and second instruction signals of logic "0" level, the first and second instruction signals of logic "0" level cause the AND gates 18f and 18g to fix the output signals thereof to logic "0" level regardless of the output node OUT2 of the input buffer circuit 12c. With the output signals of logic "0" level, the OR gate 18h supplies the output signal of logic "0" level to the exclusive-OR gate 18i, and the input nodes of the exclusive-OR gate 18i are in logic "0" level. Therefore, the exclusive-OR gate 18i fixes the output signal thereof to logic "0" level regardless of the input node of the input buffer circuit 12c (see the first row of Table 1).

If the second instruction signal is changed to logic "1" level, remaining the first instruction signal in logic "0" level, the first section 18a causes the three-state buffer circuit 12d to enter the high-impedance state, and the second section 18b fixes the input node IN2 to logic "0" level regardless of the output node OUT2. In other words, the controlling circuit block 18 causes the associated pad to enter the high-impedance state as summarized in the second row of Table 1. In detail, the AND gate 18e produces the output signal of logic "1" level, because the output signal of the inverting circuit 18e and the second instruction signal are logic "1" level. The OR gate fixes the output signal thereof to logic "1" level regardless of the input signal supplied from the input buffer circuit 12c, and both input nodes of the exclusive-OR gate 18i are in logic "1" level. This results in that the exclusive-OR gate 18i fixes the output signal to logic "0" level regardless of the input signal at the output node OUT2.

If the first instruction signal is changed to logic "1" level remaining the second instruction signal in logic "0" level, the first section 18a keeps the three-state buffer circuit 18d in the high-impedance state, and the second section 18b is responsive to the input signal at the output node OUT2 as summarized in the third row of Table 1. Namely, the input nodes of the AND gate 18e are logic "0" level, and continuously produces the output signal of logic "0" level. Since the first instruction signal is logic "1" level, the AND gate 18g transfers the input signal at the output node OUT2 to the OR gate 18h which in turn transfers the input signal to the exclusive-OR gate 18i. The second instruction signal of logic "0" level allows the exclusive-OR gate 18i to transfer the input signal to the input node IN2 of the associated function block 11b, and the bidirectional buffer circuit 12a or 12b serves as an input buffer. Thus, the controlling circuit block 18 and the associated bidirectional buffer circuit 12a or 12b or the buffer circuit means is responsive to the first and second instruction signals, and serves as one of the input buffer circuit, the output buffer circuit and the high-impedance element in so far as the first and second instruction signals are fixed. However, if the first and second instruction signals are variable in logic level, the buffer circuit means serves as a bidirectional buffer circuit or a three-state buffer circuit as will be described hereinlater.

TABLE 1

| Function of Buffer 12a(12b) | 1st Inst. Signal | 2nd Inst. Signal | OUT1 | IN2 | Pad |
|---|---|---|---|---|---|
| Output Buffer | 0 | 0 | I/O | 0 | I/O |
| High Impedance | 0 | 1 | I/O | 0 | HZ |
| Input Buffer | 1 | 0 | — | I/O | I/O |

In Table 1, "HZ" is indicative of the high-impedance state.

Description is made on the design work for a semicustom made integrated circuit. Upon acceptance of an order from a customer, the manufacturer starts the design work. First, the manufacturer selects the complete and incomplete function blocks 11a and 11b, the controlling circuit blocks 18, the unidirectional buffer circuit block 13 and the bidirectional buffer circuit block 12 from the available blocks. The manufacturer respectively assigns tasks to the complete and incomplete function blocks 11a and 11b, and designs the layout of those blocks 11a, 11b, 12, 13 and 18. Subsequently, the manufacturer completes the incomplete function blocks 11b by designing wiring arrangement. Since the incomplete function blocks 11b are assigned the tasks, the manufacturer can decide what kind of buffer circuits should be associated therewith, and designs wiring arrangements of the incomplete function blocks 11b. The wiring arrangement of each incomplete function block 11b allows not only achieving the given task but also producing the first and second instruction signals. However, the wiring arrangements of the bidirectional buffer circuit block 12 and the controlling circuit block 18 have been already designed by the manufacturer, and the manufacturer only designs the wiring arrangement of the incomplete function blocks 11b as well as the interconnections between the incomplete function blocks 11b, the complete function blocks 11a and the unidirectional buffer circuit block 13.

Figure 4:
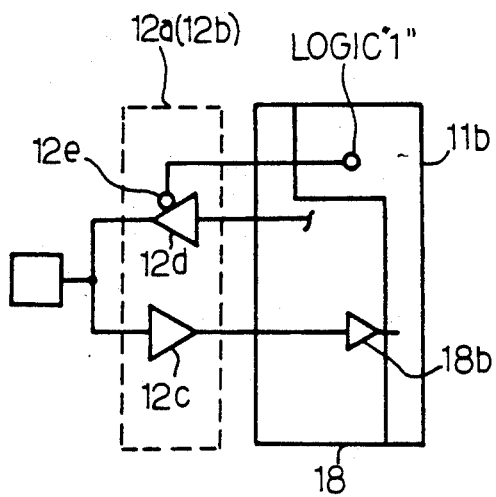
FIGS. 4 to 7 are logic diagrams showing relationship between the controlling circuit and a bidirectional buffer circuit incorporated in the semicustom made integrated circuit.

If an incomplete function block 11b needs an input buffer circuit, the wirings of the incomplete function block 11b is arranged in such a manner as to supply logic "1" level through the first section 18a to the inverting circuit 12e associated with the control node of the three-state buffer circuit 12d as shown in FIG. 4. The three-state buffer circuit 12d enters the high impedance state. However, the wirings of the incomplete function block 11b allows the second section 18b to serve as a driver circuit, and the input signal is relayed from the input buffer circuit 12c to the function block 11b.

Figure 5:
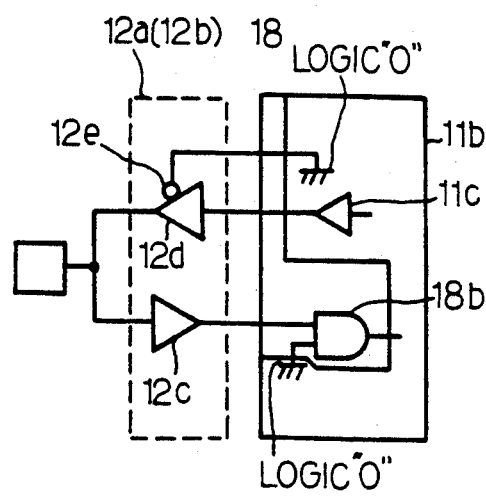

If the incomplete function block 11b needs to have an output buffer circuit, the wirings are arranged in such a manner as to supply logic "0" level as shown in FIG. 5. Logic "1" level causes the inverting circuit 12e to force the three-state buffer circuit 12d into the active state, and causes the second section 18b to never respond to the input signal supplied from the input buffer circuit 12c. The wirings of the incomplete function block 11b further causes a component logic gate to serve as an output driver circuit 11c. As a result, the buffer circuit means serves as an output buffer circuit provided in association with the incomplete function block 11b.

Figure 6:
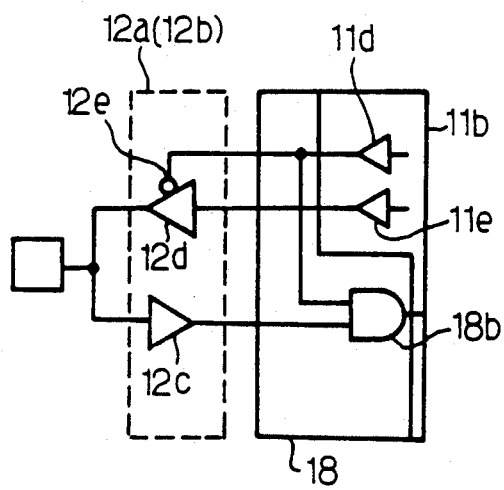

If a bidirectional buffer circuit should be associated with the incomplete function block 11b, the wirings of the incomplete function block 11b are arranged in such a manner as to form a driver circuit 11d for the first and second instruction signals as well as the driver circuit 11c for the output signal as shown in FIG. 6. The driver circuit 11d complementarily activates and deactivates the three-state buffer circuit 12d and the second section 18b, and the output signal or the input signal passes through the controlling circuit block 18.

Figure 7:
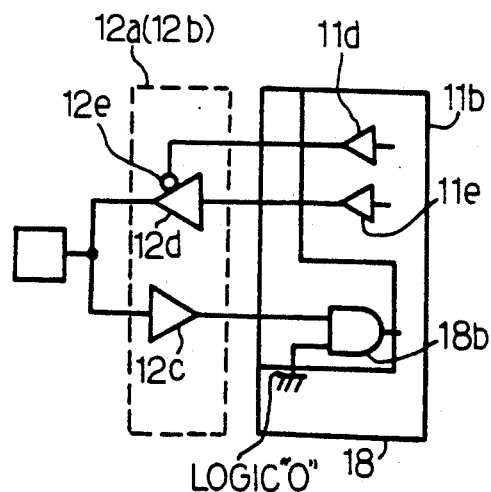

However, if the incomplete function block 11b needs to have a three-state buffer circuit, the wirings of the incomplete function block 11b are arranged in such a manner as to form the driver circuits 11d and 11e and to deactivate the second section 18b as shown in FIG. 7. The input signal at the input buffer circuit 12c is never transferred to the function block 11b, because logic "0" level is continuously supplied to the second section 18b serving as an AND gate. However, the three-state buffer circuit 12d is responsive to the first and second instruction signals, and selectively enters the high-impedance state and the active state. Therefore, the bidirectional buffer circuit 12a or 12b serves as a three-state buffer circuit.

As will be appreciated from the foregoing description, the buffer circuit means selectively serves as one of the input buffer circuit, the output buffer circuit, the bidirectional buffer circuit and the three-state buffer circuit depending upon the wiring arrangement of the associated function block, and, for this reason, the design work for the wiring arrangement is minimized. This results in that no error takes place in the design work of the wirings between the incomplete function blocks and the associated buffer circuits. In fact, the error took place about 1 percent of the wirings in the prior art semicustom made integrated circuit. However, the buffer circuit means according to the present invention eliminates the error, and speeds up the design work for the semicustom made integrated circuit.

Although particular embodiments of the present invention have been shown and described, it will be obvious to those skilled in the art that various changes and modifications may be made without departing from the spirit and scope of the present invention. For example, the complete function block may be implemented by a random access memory or by another electronic circuit.

What is claimed is:

1. A semicustom made integrated circuit fabricated on a single semiconductor chip from logic gates and conductive wirings, comprising:
   a) at least one first function block a wiring arrangement of which has been completed so as to fix the function thereof before accepting an order of a customer;
   b) at least one second function block a wiring arrangement of which is completed so as to fix the function thereof after said acceptance of said order of said customer, said at least one second function block producing instruction signals indicative of what kind of buffer circuit is necessary for said function thereof; and c) at least one buffer circuit means associated with said at least one second function block, and selectively serving as one of an input buffer, an output buffer, a bidirectional buffer and a three-state buffer depending upon said instruction signals.

2. A semicustom made integrated circuit as set forth in claim 1, in which said buffer circuit means comprises a combination block of a three state buffer circuit and an input buffer circuit, and a controlling circuit block coupled between said combination block and said at least one second function block and responsive to said instruction signals for controlling said three-state buffer circuit and for transferring or blocking an input signal supplied from said input buffer circuit.

3. A semicustom made integrated circuit fabricated on a single semiconductor chip, comprising:

a) at least one first function block a wiring arrangement of which has been completed so as to fix the function thereof before accepting an order of a customer;

b) at least one second function block a wiring arrangement of which is completed so as to fix the function thereof after said acceptance of said order of said customer, said at least one second function block producing instruction signals indicative of what kind of buffer circuit is necessary for said function thereof; and c) at least one buffer circuit means associated with said at least one second function block, and selectively serving as one of an input buffer, an output buffer, a bidirectional buffer and a three-state buffer depending upon said instruction signals, said buffer circuit means comprising a combination block of a three-state buffer circuit and an input buffer circuit, and a controlling circuit block coupled between said combination block and said at least one second function block and responsive to said instruction signals for controlling said three-state buffer circuit and for transferring or blocking an input signal supplied from said input buffer circuit, said controlling circuit block comprising a first section responsive to said instruction signals for shifting said three-state buffer circuit between a high-impedance state and an active state, and causing said three-state buffer circuit to transfer an output signal from said at least one second function block to an associated pad in said active state, and a second section responsive to said instruction signals for transferring or blocking said input signal to said at least one second function block.

4. A semicustom made integrated circuit as set forth in claim 3, in which said first section comprises a first OR gate responsive to said instruction signals for producing a controlling signal supplied to a first inverting circuit coupled with a control node of said three-state buffer circuit, and a conductive path coupled with an output node of said at least one second function block for propagating said output signal to an input node of said three-state buffer circuit.

5. A semicustom made integrated circuit as set forth in claim 3, in which said second section comprises a second inverting circuit supplied with one of said instruction signals, a first AND gate supplied with an output signal of said second inverting circuit and the other of said instruction signals, a second AND gate supplied with said one of said instruction signals and said input signal, a second OR gate supplied with output signals of said first and second AND gates, and an exclusive-OR gate supplied with an output signal of said second OR gate and the other of said instruction signals.

6. A semicustom made integrated circuit as set forth in claim 5, in which each of said instruction signals is fixed to either a first or a second logic level.

7. A semicustom made integrated circuit as set forth in claim 5, in which each of said instruction signals is variable in logic level.

* * * * *